(12) United States Patent
Kuo et al.

(10) Patent No.: US 9,887,007 B1
(45) Date of Patent: Feb. 6, 2018

(54) VARIABLE-RESISTANCE MEMORY AND WRITING METHOD THEREOF

(71) Applicant: Industrial Technology Research Institute, Hsinchu (TW)

(72) Inventors: Chia-Chen Kuo, Hualien County (TW); Shyh-Shyuan Sheu, Taipei (TW)

(73) Assignee: Industrial Technology Research Institute, Hsinchu (TW)

( * ) Notice: Subject to any disclaimer, the term of this patent is extended or adjusted under 35 U.S.C. 154(b) by 0 days.

(21) Appl. No.: 15/381,703

(22) Filed: Dec. 16, 2016

(30) Foreign Application Priority Data

Nov. 4, 2016 (TW) .............................. 105135853 A

(51) Int. Cl.
*G11C 5/06* (2006.01)
*G11C 13/00* (2006.01)

(52) U.S. Cl.
CPC ...... *G11C 13/0069* (2013.01); *G11C 13/0061* (2013.01)

(58) Field of Classification Search
CPC ............ G11C 13/0069; G11C 11/5678; G11C 13/0004; G11C 8/10
See application file for complete search history.

(56) References Cited

U.S. PATENT DOCUMENTS 7,599,209 B2    10/2009  Hoenigschmid et al.
9,082,496 B2    7/2015   Lee et al.
9,087,583 B2    7/2015   Di Vincenzo et al.
(Continued)

FOREIGN PATENT DOCUMENTS

CN    104464816 A    3/2015
TW    201120997      6/2011
(Continued)

OTHER PUBLICATIONS

Taiwan Patent Office, Office Action, Patent Application Serial No. 105135853, dated Apr. 13, 2017, Taiwan.
(Continued)

*Primary Examiner* — Tuan T Nguyen

(57) ABSTRACT

A variable-resistance memory and a writing method thereof are provided. The variable-resistance memory includes a variable-resistance memory cell, a voltage-signal-generation circuit, a switch circuit, a detection circuit, and a controller. The variable-resistance memory cell includes a variable-resistance component and a transistor. The voltage-signal-generation circuit is coupled to the control terminal of the transistor. The switch circuit is coupled to the variable-resistance component and transistor. The detection circuit is coupled to a voltage source and the switch circuit. The controller is coupled to the voltage-signal-generation circuit, switch circuit, and detection circuit. When the controller performs a writing operation on the variable-resistance memory cell, the voltage-signal-generation circuit provides a voltage signal to the transistor, and the detection circuit continuously detects whether the variable-resistance component performs a resistance conversion. If the resistance conversion occurs, then the controller stops the writing operation.

19 Claims, 12 Drawing Sheets

(56) References Cited

U.S. PATENT DOCUMENTS

| | | | |
|---|---|---|---|
| 9,123,414 | B2 | 9/2015 | Kitagawa et al. |
| 9,135,996 | B2 | 9/2015 | Kim et al. |
| 9,153,317 | B2 | 10/2015 | Kitagawa et al. |
| 9,196,354 | B2 | 11/2015 | Strachan et al. |
| 9,196,360 | B2 | 11/2015 | Chou et al. |
| 9,257,177 | B2 | 2/2016 | Foong et al. |
| 9,257,178 | B1 | 2/2016 | Chou |
| 9,305,647 | B2 | 4/2016 | Li |
| 9,311,996 | B2 | 4/2016 | Ogiwara et al. |
| 9,312,001 | B1 | 4/2016 | Huang |
| 9,312,003 | B2 | 4/2016 | Tanaka et al. |
| 9,312,004 | B1 | 4/2016 | Cho et al. |
| 9,324,421 | B2 | 4/2016 | Perner et al. |
| 2006/0028872 | A1 | 2/2006 | Rolandi et al. |
| 2008/0158936 | A1 | 7/2008 | Bertin et al. |
| 2010/0027326 | A1* | 2/2010 | Kim ............ G11C 11/56 365/163 |
| 2010/0110767 | A1* | 5/2010 | Katoh ............ G11C 8/08 365/148 |
| 2011/0128773 | A1* | 6/2011 | Azuma ......... G11C 13/0007 365/148 |
| 2015/0049547 | A1 | 2/2015 | Kim |
| 2016/0071588 | A1 | 3/2016 | Harrand et al. |
| 2016/0071589 | A1 | 3/2016 | Thomas et al. |

FOREIGN PATENT DOCUMENTS

| | | |
|---|---|---|
| TW | 201216281 | 4/2012 |
| TW | 201444131 | 11/2014 |
| TW | 201514990 A | 4/2015 |

OTHER PUBLICATIONS

Meng-Fan Chang et al. "19.4 Embedded 1Mb ReRAM in 28nm CMOS with 0.27-to-1V Read Using Swing-Sample-and-Couple Sense Amplifier and Self-Boost-Write-Termination Scheme," Solid-State Circuits Conference Digest of Techinical Papers, Feb. 2014, pp. 332-333, vol. 57, IEEE, US.

Shyh-Shyuan Sheu et al. "A 5ns Fast Write Multi-Level Non-Volatile 1 K bits RRAM Memory with Advance Write Scheme," 2009 Symposium on VLSI Circuits Digest of Technical Papers, Jun. 2009, pp. 82-83, IEEE, US.

X.Y. Xue et al. "A 0.13um 8Mb logic based CuxSiyO resistive memory with self-adaptive yield enhancement and operation power reduction," 2012 Symposium on VLSI Circuits Digest of Technical Papers, Jun. 2012, pp. 42-43, IEEE, US.

\* cited by examiner

VARIABLE-RESISTANCE MEMORY AND WRITING METHOD THEREOF

CROSS REFERENCE TO RELATED APPLICATION

The present application is based on, and claims priority from, Taiwan Application Serial Number 105135853, filed on Nov. 4, 2016, the disclosure of which is hereby incorporated by reference herein in its entirety.

TECHNICAL FIELD

The disclosure relates to a variable-resistance memory and a writing method thereof.

BACKGROUND

A variable-resistance memory stores different data based on different resistance. For example, a low resistance value may represent "0", and a high resistance value may represent "1". In general, different data, which is written to the variable-resistance memory, may correspond to different writing operations of the variable-resistance memory.

For example, when writing "0" (which is represented by a low resistance), the variable-resistance memory may perform the low resistance during the writing operation. In such cases, the variable-resistance memory usually makes the current below the clamping current to control the resistance of the component in the variable-resistance memory. In general, the resistance of the component is controlled by the voltage on the word line (WL), but the clamping current may change due to the process variation of the transistors.

On the other hand, when writing "1" (which is represented by a high resistance), the voltage on the word line should be controlled carefully. If the voltage on the word line is too low, then the writing operation may fail or perform the resistance which is too low. If the voltage on the word line is too high, then the components in the variable-resistance memory may be damaged, which causes the malfunction of the variable-resistance memory. In general, when writing "1" (which is represented by a high resistance) to the variable-resistance memory, it usually protects the circuit by performing the writing-verification operation. For example, the writing-verification operation may verify the variable-resistance memory. If the data is not written into the variable-resistance memory successfully, then the writing-verification operation increases the voltage on the word line and performs the writing operation again. The verification and the writing operation of the writing-verification operation are executed repeatedly until the verification shows that the data is successfully written into the variable-resistance memory. The writing-verification operation described above may spend extra energy and operation time.

SUMMARY

One exemplary embodiment provides a variable-resistance memory. The variable-resistance memory comprises a variable-resistance memory cell, a voltage-signal-generation circuit, a switch circuit, a detection circuit, and a controller.

The variable-resistance memory cell comprises a variable-resistance component and a transistor. A first terminal of the transistor is connected to a first terminal of the variable-resistance component. The voltage-signal-generation circuit is coupled to a control terminal of the transistor. The switch circuit is coupled to a second terminal of the transistor and a second terminal of the variable-resistance component. The detection circuit is coupled to a voltage source, wherein a first terminal and a second terminal of the detection circuit are coupled to the switch circuit. The controller is coupled to the voltage-signal-generation circuit, the switch circuit, and the detection circuit.

The controller executes control actions when the controller performs the first writing operation on the variable-resistance memory cell. The control actions include controlling the switch circuit to make the second terminal of the variable-resistance component couple to the first terminal of the detection circuit and make the second terminal of the transistor couple to the second terminal of the detection circuit; activating the detection circuit to let the detection circuit continuously detect a first current flowing through the variable-resistance component; and activating the voltage-signal-generation circuit to let the voltage-signal-generation circuit provide a voltage signal to the control terminal of the transistor.

If the detection circuit determines that the first current is less than a first predetermined current when the controller performs the first writing operation on the variable-resistance memory cell, then the detection circuit transmits a detection signal to the controller to make the controller stop performing the first writing operation.

One exemplary embodiment provides a writing method of a variable-resistance memory. The writing method includes performing, by a controller, a first writing operation on a variable-resistance memory cell. The first writing operation includes controlling, by the controller, a switch circuit to make a first terminal of a variable-resistance component of the variable-resistance memory cell couple to a first terminal of a detection circuit and make a first terminal of a transistor of the variable-resistance memory cell couple to a second terminal of the detection circuit; activating, by the controller, the detection circuit to let the detection circuit continuously detect a first current flowing through the variable-resistance component; activating, by the controller, a voltage-signal-generation circuit to let the voltage-signal-generation circuit provide a voltage signal to a control terminal of the transistor; and if the detection circuit determines that the first current is less than a first predetermined current, then the detection circuit transmits a detection signal to the controller to make the controller stop performing the first writing operation.

BRIEF DESCRIPTION OF DRAWINGS

The present disclosure can be more fully understood by reading the subsequent detailed description and examples with references made to the accompanying drawings, wherein.

DETAILED DESCRIPTION

Figure 1:
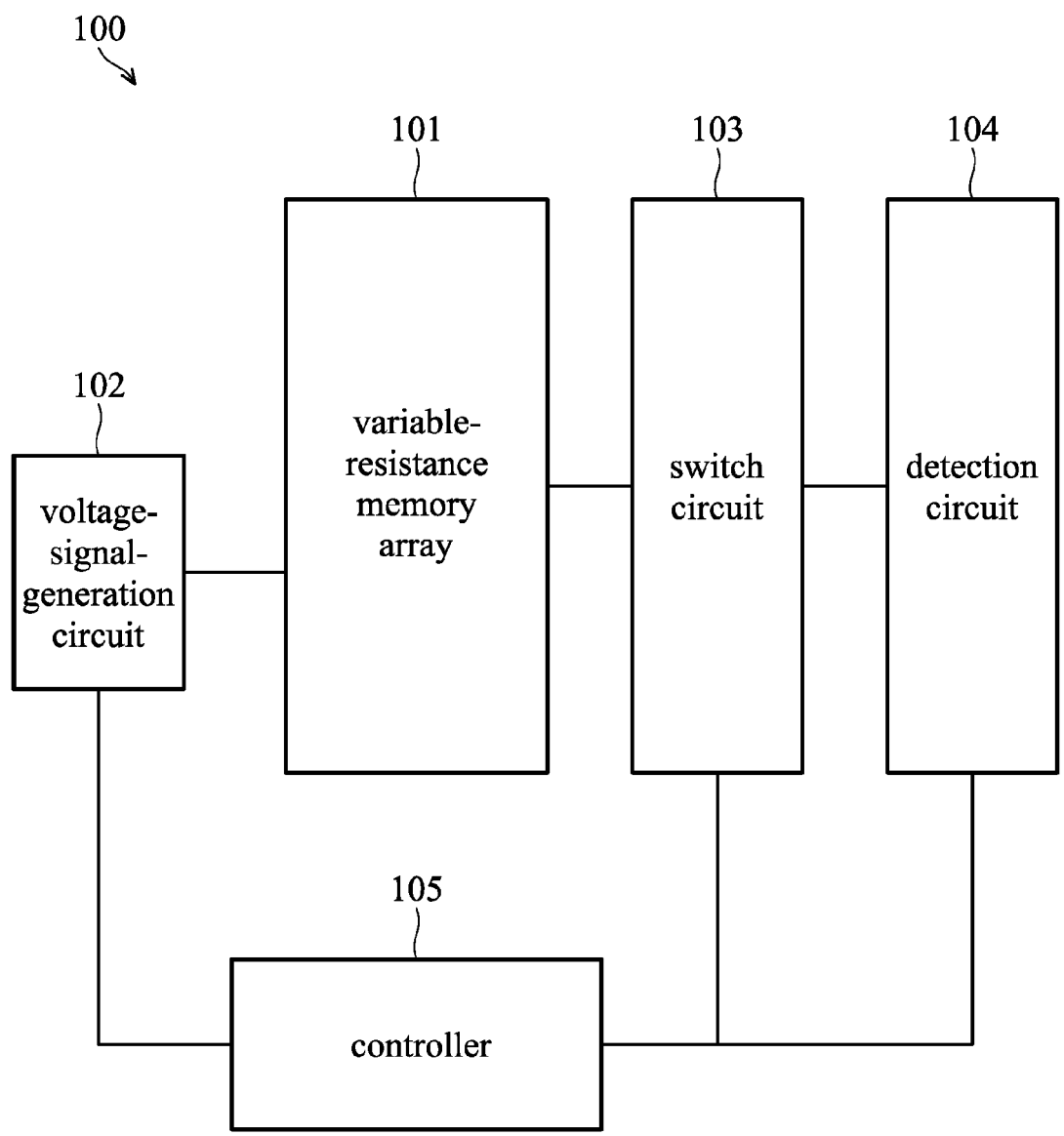
FIG. 1 is a schematic view of a variable-resistance memory according to an exemplary embodiment.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

FIG. 1 is a schematic view of a variable-resistance memory 100 according to an exemplary embodiment. The variable-resistance memory 100 stores data based on different resistance. The variable-resistance memory 100 includes a variable-resistance memory array 101, a voltage-signal-generation circuit 102, a switch circuit 103, a detection circuit 104, and a controller 105. When the controller 105 performs a writing operation on at least one variable-resistance memory cell of the variable-resistance memory array 101, the controller 105 controls the switch circuit 103 to make the variable-resistance memory cell, which is selected and performed the writing operation by the controller 105, couple to the detection circuit 104. Afterward, the detection circuit 104 may provide voltage to the selected variable-resistance memory cell and detect the current flowing through the selected variable-resistance memory cell.

After the selected variable-resistance memory cell is coupled to the detection circuit 104 through the switch circuit 103, the controller 105 activates the voltage-signal-generation circuit 102 to provide a voltage signal of the voltage-signal-generation circuit 102 to the selected variable-resistance memory cell. The voltage signal may gradually change over time, and the current flowing through the selected variable-resistance memory cell may be changed based on the voltage signal.

When the voltage value of the voltage signal is substantially equal to a specific voltage value, the resistance of the variable-resistance component of the variable-resistance memory cell performs a resistance conversion, such as the variable-resistance component may be converted from high resistance to low resistance or converted from low resistance to high resistance. The detection circuit 104 then detects the current variation caused by the resistance conversion (i.e. the current variation of the selected variable-resistance memory cell) and transmits a detection signal corresponding to the resistance conversion to the controller 105. The controller 105 stops performing the writing operation on the selected variable-resistance memory cell based on the detection result of the detection circuit 104.

In some embodiments, the voltage signal of the voltage-signal-generation circuit 102 may have a voltage waveform which gradually increases during the writing operation, but the embodiments are not limited thereto.

Figure 2A:
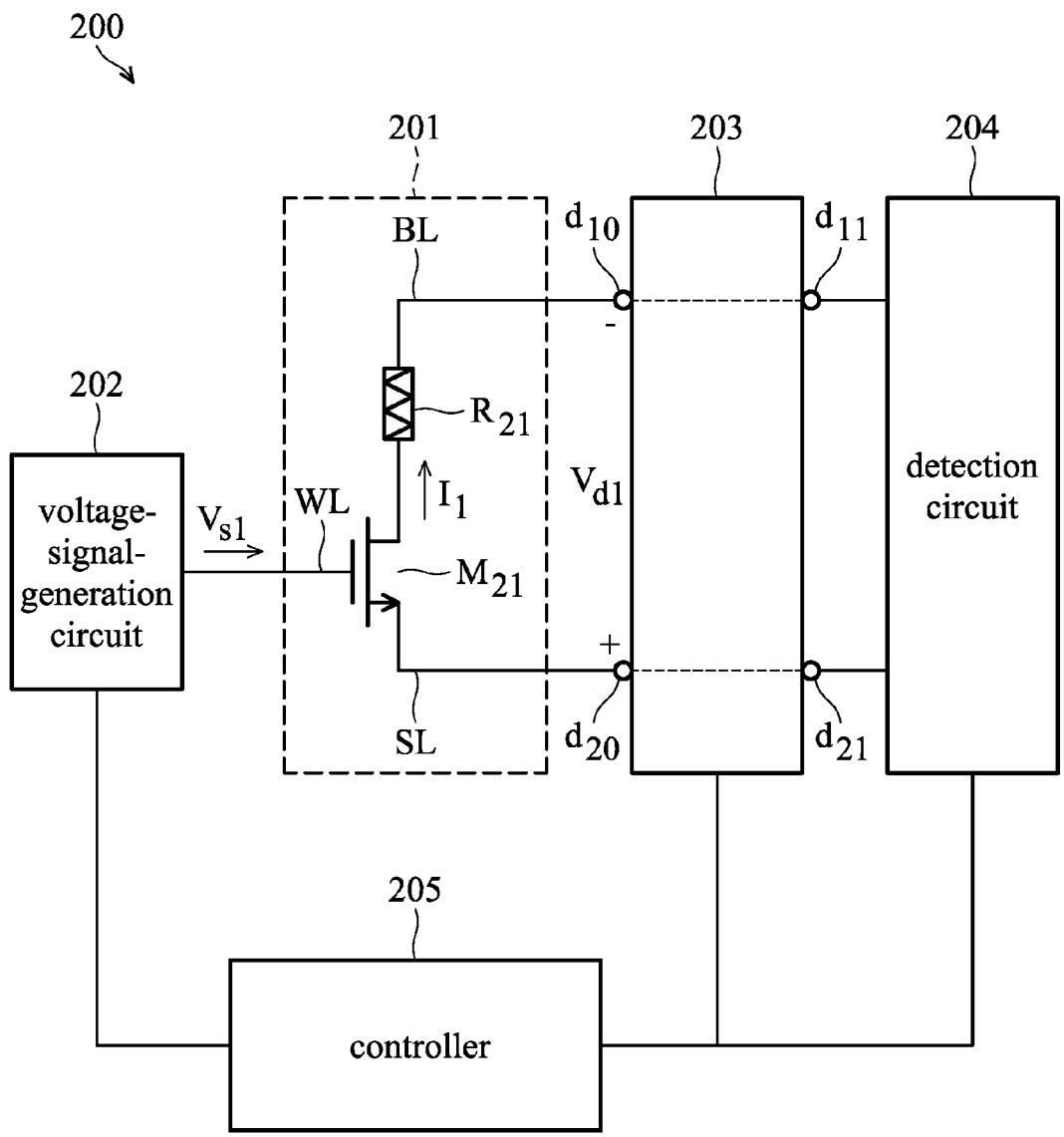
FIG. 2A-2B are schematic views of variable-resistance memory circuits according to some exemplary embodiments.

FIG. 2A is a schematic view of a variable-resistance memory 200 according to some exemplary embodiments. FIG. 2 depicts a first writing operation of a selected variable-resistance memory cell 201 in a variable-resistance memory array of a variable-resistance memory 200. In this embodiment, the variable-resistance memory 200 includes a variable-resistance memory cell 201, a voltage-signal-generation circuit 202, a switch circuit 203, a detection circuit 204, and a controller 205.

The variable-resistance memory cell 201 includes a variable-resistance component $R_{21}$ and a transistor $M_{21}$. The variable-resistance component $R_{21}$ and the transistor $M_{21}$ are connected to each other. The voltage-signal-generation circuit 202 is connected to a control terminal of the transistor $M_{21}$ (e.g., a gate terminal of the transistor $M_{21}$) and utilized to provide voltage signal $V_{s1}$ to the control terminal of the transistor $M_{21}$, wherein the control terminal is connected to a word line WL of the variable-resistance memory array. The switch circuit 203 is connected to a terminal $d_{20}$ of the transistor $M_{21}$, a terminal $d_{10}$ of the variable-resistance component $R_{21}$, and terminals $d_{11}$ and $d_{21}$ of the detection circuit 204. The terminal $d_{20}$ is connected to a source line SL of the variable-resistance memory array, and the terminal $d_{10}$ is connected to a bit line BL of the variable-resistance memory array. In this embodiment, the detection circuit 204 is coupled to a voltage source (not shown in FIG. 2A), and the controller 205 is connected to, and utilized to control, the voltage-signal-generation circuit 202, the switch circuit 203, and the detection circuit 204.

As shown in FIG. 2A, controller 205 may perform the first writing operation on the variable-resistance memory cell 201. In such cases, the controller 205 may control the switch circuit 203 to couple the terminal $d_{10}$ of the variable-resistance component $R_{21}$ and the terminal $d_{20}$ of the transistor $M_{21}$ to the terminal $d_{11}$ and the terminal $d_{21}$ of the detection circuit 204, respectively. Under these conditions, the detection circuit 204 can provide voltage $V_{d1}$ to the variable-resistance memory cell 201 and detect the current $I_1$ of the variable-resistance memory cell 201. Afterward, the controller 205 may activate voltage-signal-generation circuit 202 to transmit a voltage signal $V_{s1}$ to the control terminal of the transistor $M_{21}$. In this embodiment, the current $I_1$ which flows through the transistor $M_{21}$ and the variable-resistance component $R_{21}$ may be changed according to the voltage signal $V_{s1}$. When the current $I_1$ increases, the voltage measured across the variable-resistance component $R_{21}$ also increases. Accordingly, when the voltage signal $V_{s1}$ of the voltage-signal-generation circuit 202 is substantially equal to a specific voltage value, the specific voltage value causes the current $I_1$, which flows through the transistor $M_{21}$ and the variable-resistance component $R_{21}$, to be substantially equal to a specific current, which makes the variable-resistance component $R_{21}$ receive sufficient bias voltage to perform a resistance conversion. The resistance conversion changes the resistance of the variable-resistance component $R_{21}$ from low resistance to high resistance. After the variable-resistance component $R_{21}$ performs the resistance conversion, the current $I_1$ is reduced because of the resistance conversion, and the detection circuit 204 detects that the current $I_1$ is less than a predetermined current. In such cases, the detection circuit 204 transmits a detection signal corresponding to the current $I_1$, which is less than the predetermined current, to the controller 205. The controller 205 stops performing the first writing operation on the variable-resistance memory cell 201 based on the detection signal.

In some embodiments, when the variable-resistance memory cell 201 is not selected to be written and the controller 205 performs at least one writing operation on one or more of other variable-resistance memory cells, the controller 205 controls the switch circuit 203 to disconnect the connection between the variable-resistance memory cell 201 and the detection circuit 204. In some embodiments, when the variable-resistance memory cell 201 is not selected to be written and the controller 205 performs at least one writing operation on one or more of other variable-resistance memory cells, the controller controls the switch circuit 203 to make the terminal $d_{10}$ and terminal $d_{20}$ of the variable-resistance memory cell 201 connect to the same voltage node, such as voltage supply or ground. In some embodiments, the transistor $M_{21}$ may be an N-type metal-oxide-semiconductor field effect transistor (MOSFET), and the voltage signal $V_{s1}$ of the voltage-signal-generation circuit 202 has a voltage waveform which increases during the first writing operation. In some embodiments, the transistor $M_{21}$ may be a P-type MOSFET, and the voltage signal $V_{s1}$ of the voltage-signal-generation circuit 202 has a voltage waveform which decreases during the first writing operation. In some embodiments, the transistor $M_{21}$ may be any component whose conductive current and the input voltage are proportional to each other. In some embodiments, when the controller 205 stops performing the first writing operation on the variable-resistance memory cell 201, the controller 205 controls the switch 203 to disconnect the connection between the transistor $M_{21}$ and the detection circuit 204 or disconnect the connection between the variable-resistance component $R_{21}$ and the detection circuit 204. In some embodiments, when the controller 205 stops performing the first writing operation on the variable-resistance memory cell 201, the controller 205 turns off the voltage-signal-generation 202 or the detection circuit 204. In some embodiments, variable-resistance component $R_{21}$ may be adopted by a Spin Torque Transfer (STT) random access memory (RAM), a unipolar resistance random access memory, or a bipolar resistance random access memory, etc.

Figure 2B:
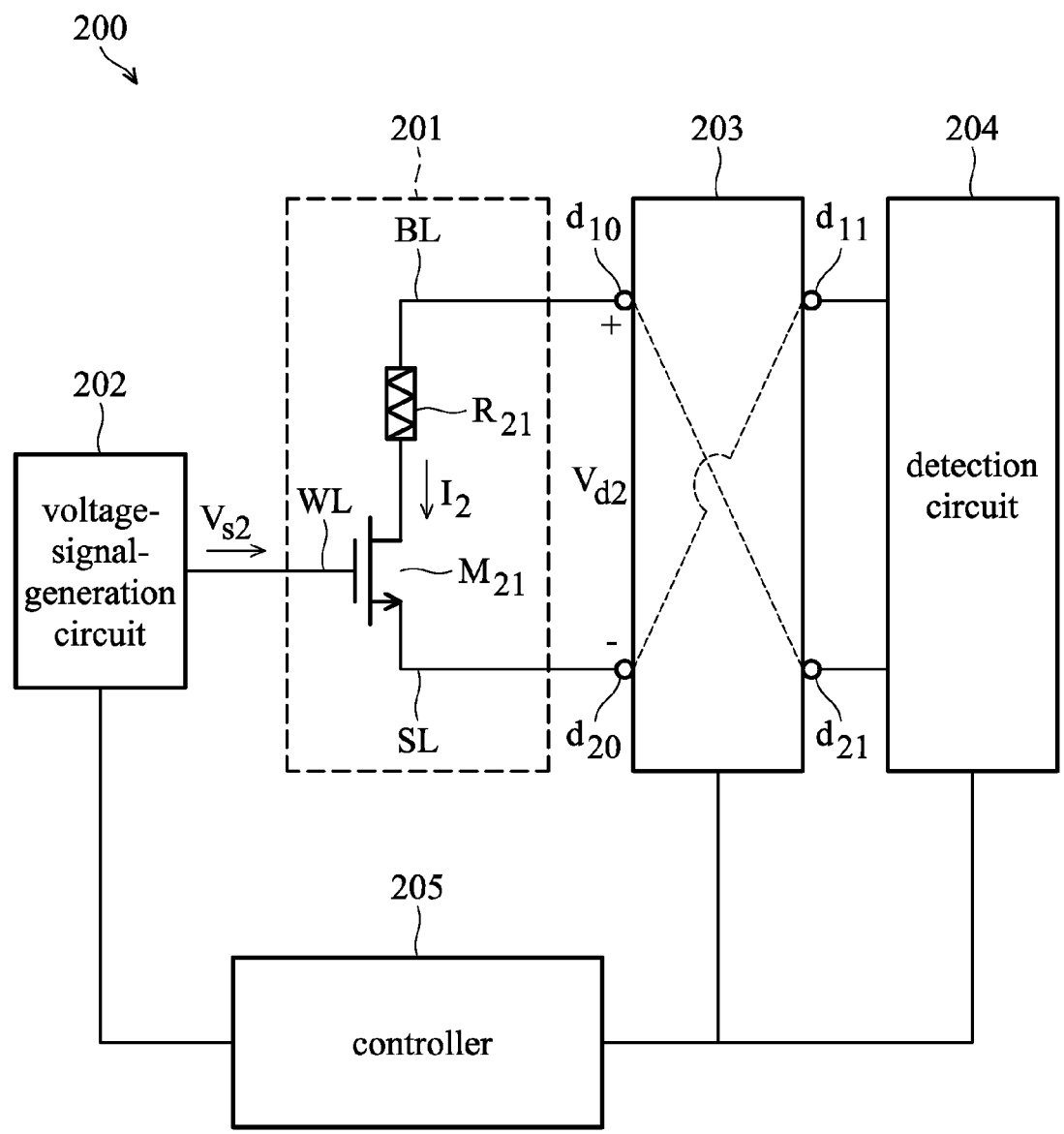

An embodiment of a second writing operation for the variable-resistance memory cell 201 of the variable-resistance memory 200 is illustrated in FIG. 2B. In this embodiment, the controller 205 may control the switch circuit 203 to couple the terminal $d_{10}$ of the variable-resistance component $R_{21}$ and the terminal $d_{20}$ of the transistor $M_{21}$ to the terminal $d_{21}$ and the terminal $d_{11}$ of the detection circuit 204, respectively. Under these conditions, the detection circuit 204 can provide voltage $V_{d2}$ to the variable-resistance memory cell 201 and detect the current $I_2$ of the variable-resistance memory cell 201. Afterward, the controller 205 may activate voltage-signal-generation circuit 202 to transmit a voltage signal $V_{s2}$ to the control terminal of the transistor $M_{21}$. In this embodiment, the current $I_2$ which flows through the transistor $M_{21}$ and the variable-resistance component $R_{21}$ may be changed according to the voltage signal $V_{s2}$. When the current $I_2$ increases, the voltage measured across the variable-resistance component $R_{21}$ also increases. Accordingly, when the voltage signal $V_{s2}$ of the voltage-signal-generation circuit 202 is substantially equal to a second specific voltage value (or the specific voltage value described above), the second specific voltage value (or the specific voltage value described above) causes the current $I_2$, which flows through the transistor $M_{21}$ and the variable-resistance component $R_{21}$, to be substantially equal to a second specific current (or the specific current described above), which makes the variable-resistance component $R_{21}$ receive sufficient bias voltage to perform a second resistance conversion. In this embodiment, the second resistance conversion changes the resistance of the variable-resistance component $R_{21}$ from high resistance to low resistance. After the variable-resistance component $R_{21}$ performs the second resistance conversion, the current $I_2$ is increased because of the resistance conversion, and the detection circuit 204 detects that the current $I_2$ is greater than a second predetermined current. In such cases, the detection circuit 204 transmits a second detection signal corresponding to the current $I_2$, which is greater than the second predetermined current, to the controller 205. The controller 205 stops performing the second writing operation on the variable-resistance memory cell 201 according to the second detection signal.

In some embodiments, the transistor $M_{21}$ may be an N-type metal-oxide-semiconductor field effect transistor (MOSFET), and the voltage signal $V_{s2}$ of the voltage-signal-generation circuit 202 has a voltage waveform which increases during the second writing operation. In some embodiments, the transistor $M_{21}$ may be a P-type MOSFET, and the voltage signal $V_{s2}$ of the voltage-signal-generation circuit 202 has a voltage waveform which decreases during the second writing operation. In some embodiments, when the controller 205 stops performing the second writing operation on the variable-resistance memory cell 201, the controller 205 controls the switch 203 to disconnect the connection between the transistor $M_{21}$ and the detection circuit 204 or disconnect the connection between the variable-resistance component $R_{21}$ and the detection circuit 204. In some embodiments, when the controller 205 stops performing the second writing operation on the variable-resistance memory cell 201, the controller 205 turns off the voltage-signal-generation 202 or the detection circuit 204. In some embodiments, the switch circuit 203 may include a plurality of switch components, such as transistors. In some embodiments, the sizes of the components of the detection circuit 204 may be increased (e.g., transistor with larger size or passive component with larger size) to reduce the impact of the process variation. In some embodiments, the voltage signal $V_{s1}$ and the voltage signal $V_{s2}$ may have the same voltage waveform.

In this embodiment, voltage signal $V_{s1}$ and voltage signal Vs2 respectively control current $I_1$ and $I_2$ through transistor $M_{21}$. When a variable-resistance memory cell (e.g., variable-resistance memory cell 201) of the variable-resistance memory array is not operating (i.e. the variable-resistance memory cell is not selected to be read or written), the leakage current of the variable-resistance memory cell can be reduced based on the arrangement of the transistor $M_{21}$. Additionally, the voltage signal $V_{s1}$ or voltage signal Vs2 provided by the voltage-signal-generation circuit 202 during the writing operation may not be affected by the variation of the variable-resistance component $R_{21}$, so the malfunction of writing operation may be avoided.

Figure 3A:
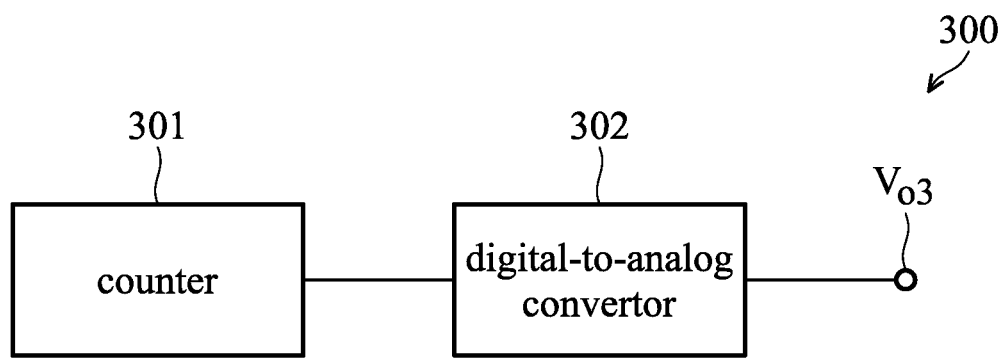
FIG. 3A is a schematic view of a voltage-signal-generation circuit according to an exemplary embodiment.
Figure 3B:
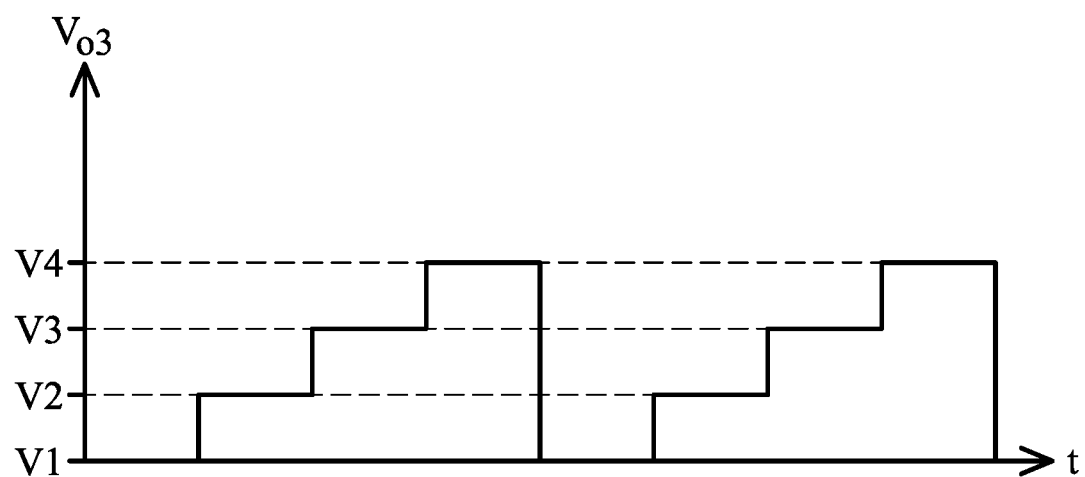
FIG. 3B is an output signal waveform of the voltage-signal-generation circuit of FIG. 3A.

FIG. 3A is a schematic view of a voltage-signal-generation circuit 300 according to an exemplary embodiment. The voltage-signal-generation circuit 300 includes the counter 301 and digital-to-analog convertor 302. In one embodiment, the counter 301 may be a two-bit counter, and the digital-to-analog convertor 302 may be a two-bit digital-to-analog convertor. In that case, the output voltage $V_{o3}$ of the voltage-signal-generation circuit 300 may be illustrated as FIG. 3B. As shown in FIG. 3B, the voltage-signal-generation circuit 300 can generate a voltage waveform that gradually increases over a period of time, such as the voltage waveform represented by the voltage $V_1$ to voltage $V_4$, wherein the voltage $V_1$ to voltage $V_4$ correspond to the output signal of the two-bit counter.

Figure 4A:
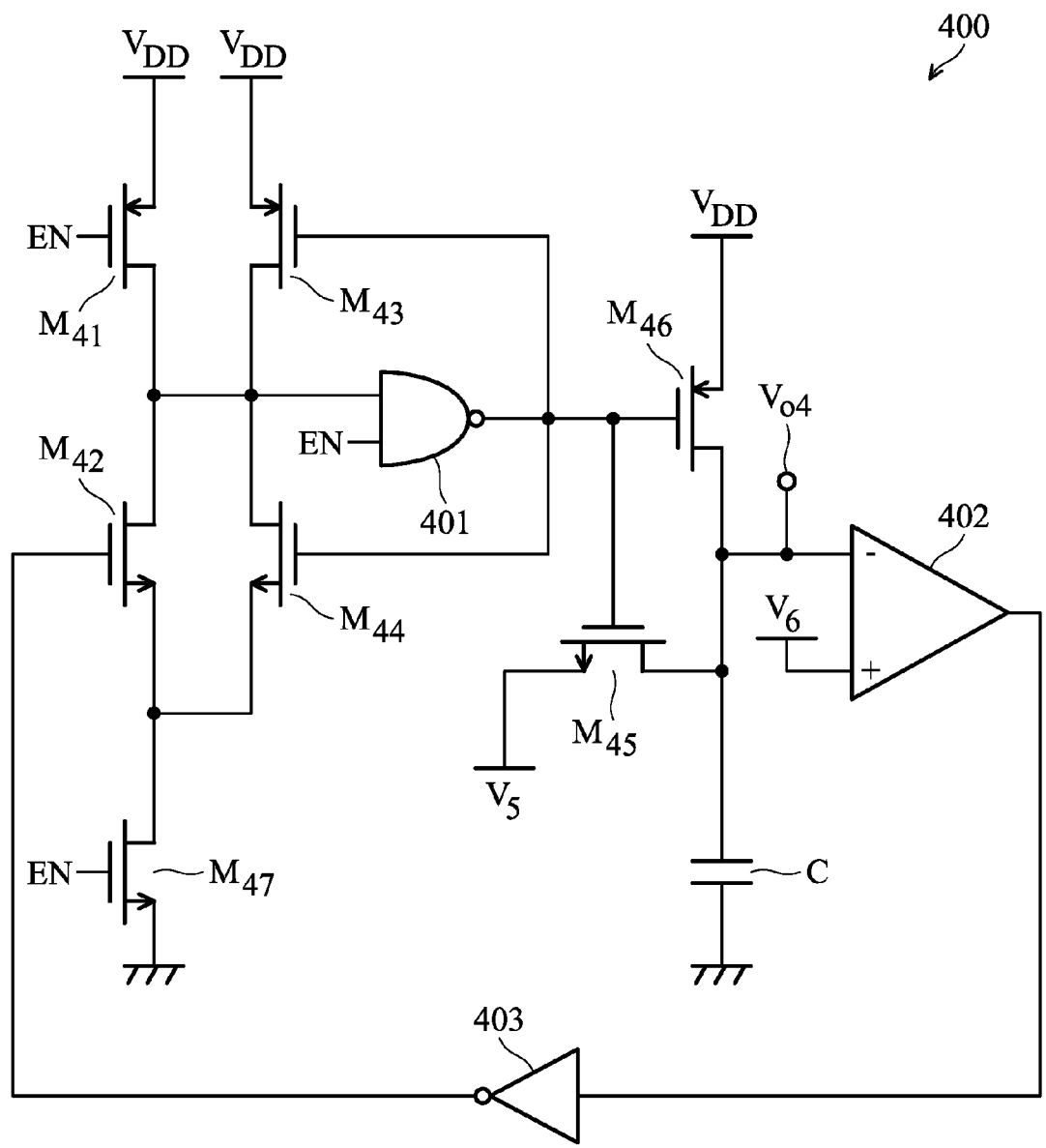
FIG. 4A is a schematic view of a voltage-signal-generation circuit according to an exemplary embodiment.
Figure 4B:
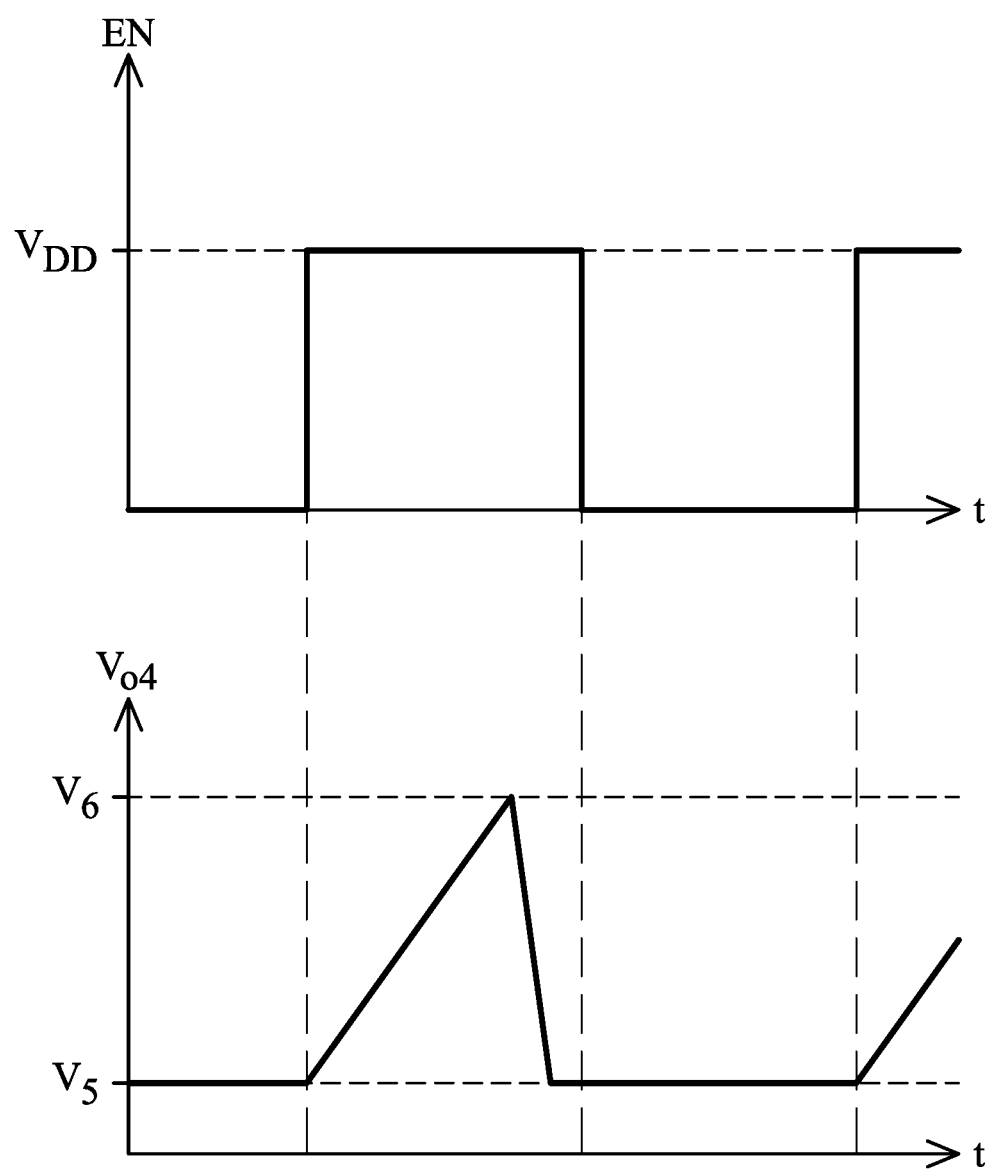
FIG. 4B is an output signal waveform of the voltage-signal-generation circuit of FIG. 4A.

FIG. 4A is a schematic view of a voltage-signal-generation circuit 400 according to an exemplary embodiment. The voltage-signal-generation circuit 400 includes transistors $M_{41}$-$M_{47}$, a NAND logic gate 401, an operational amplifier 402, a NOT logic gate 403, and a capacitor C. The voltage-signal-generation circuit 400 is connected to a supply voltage $V_{DD}$, voltage $V_5$, and voltage $V_6$. The output voltage $V_{o4}$ of the voltage-signal-generation circuit 400 is illustrated in FIG. 4B. As shown in FIG. 4B, based on the control signal EN, the output voltage $V_{o4}$ may have a voltage waveform which gradually increases over a period of time (i.e. from the voltage $V_5$ to the voltage $V_6$). In this embodiment, transistors $M_{41}$, $M_{43}$, and $M_{46}$ are P-type MOSFET, and the transistors $M_{42}$, $M_{44}$, $M_{45}$, and $M_{47}$ are N-type MOSFET.

Figure 5A:
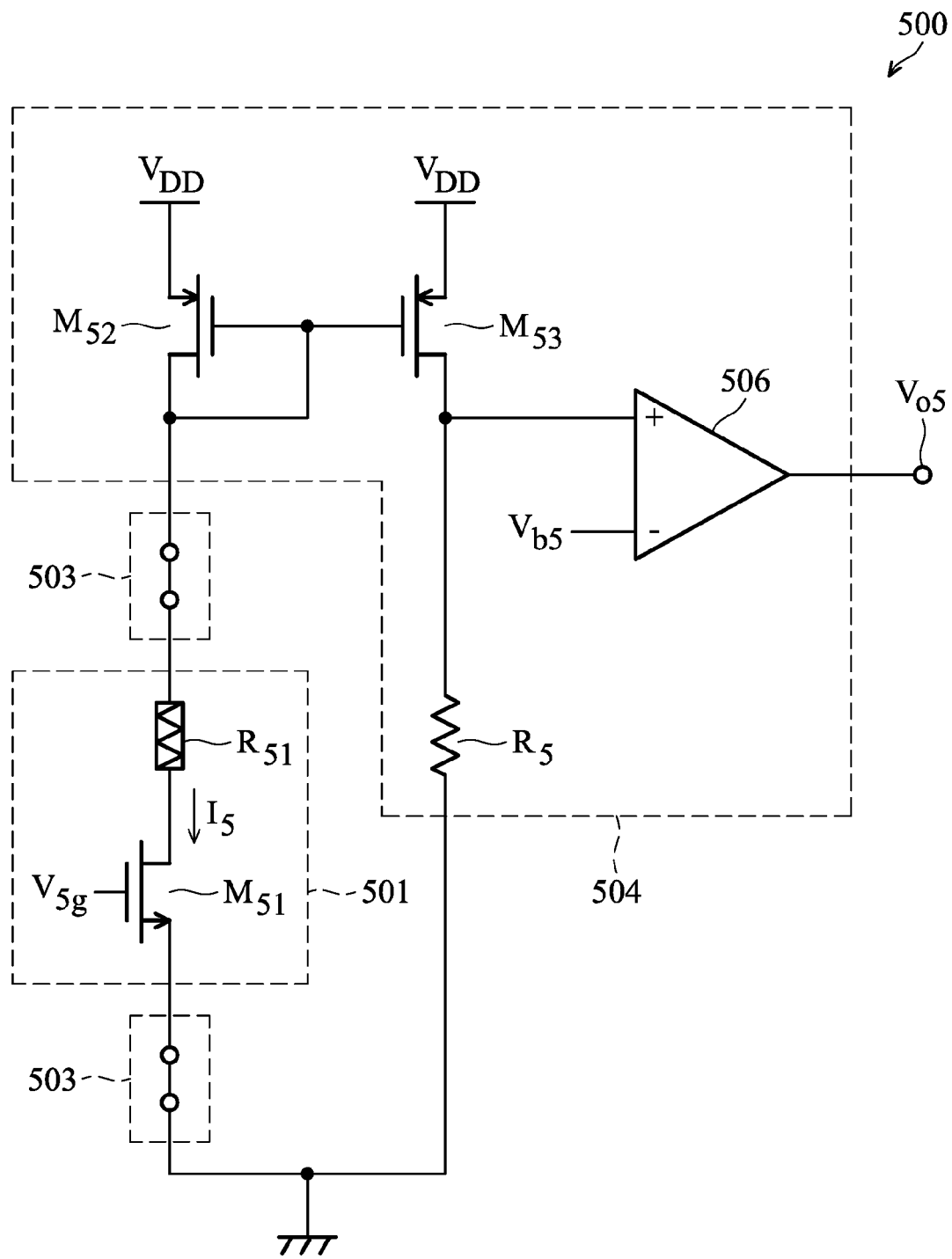
FIG. 5A is a schematic view for a writing operation according to an exemplary embodiment.

FIG. 5A is a schematic view for a writing operation of a variable-resistance memory 500 according to an exemplary embodiment. FIG. 5A depicts a variable-resistance memory circuit 500 including a variable-resistance memory cell 501, a switch circuit 503, and a detection circuit 504. The circuit arrangement in FIG. 5A may correspond to the circuit arrangement of the second writing operation in FIG. 2B.

The variable-resistance memory cell 501 includes a transistor $M_{51}$ and a variable-resistance component $R_{51}$. The gate of the transistor $M_{51}$ receives a voltage signal $V_{5g}$ transmitted from a voltage-signal-generation circuit of the variable-resistance memory 500. The detection circuit 504 includes a current mirror circuit consisting of transistors $M_{52}$ and $M_{53}$, the operational amplifier 506, and the resistor $R_5$, wherein the detection circuit 504 is coupled to a supply voltage $V_{DD}$ and a voltage $V_{b5}$. In this embodiment, the detection circuit 504 continuously detects the current $I_5$ flowing through the transistor $M_{51}$ and the variable-resistance component $R_{51}$.

Figure 5B:
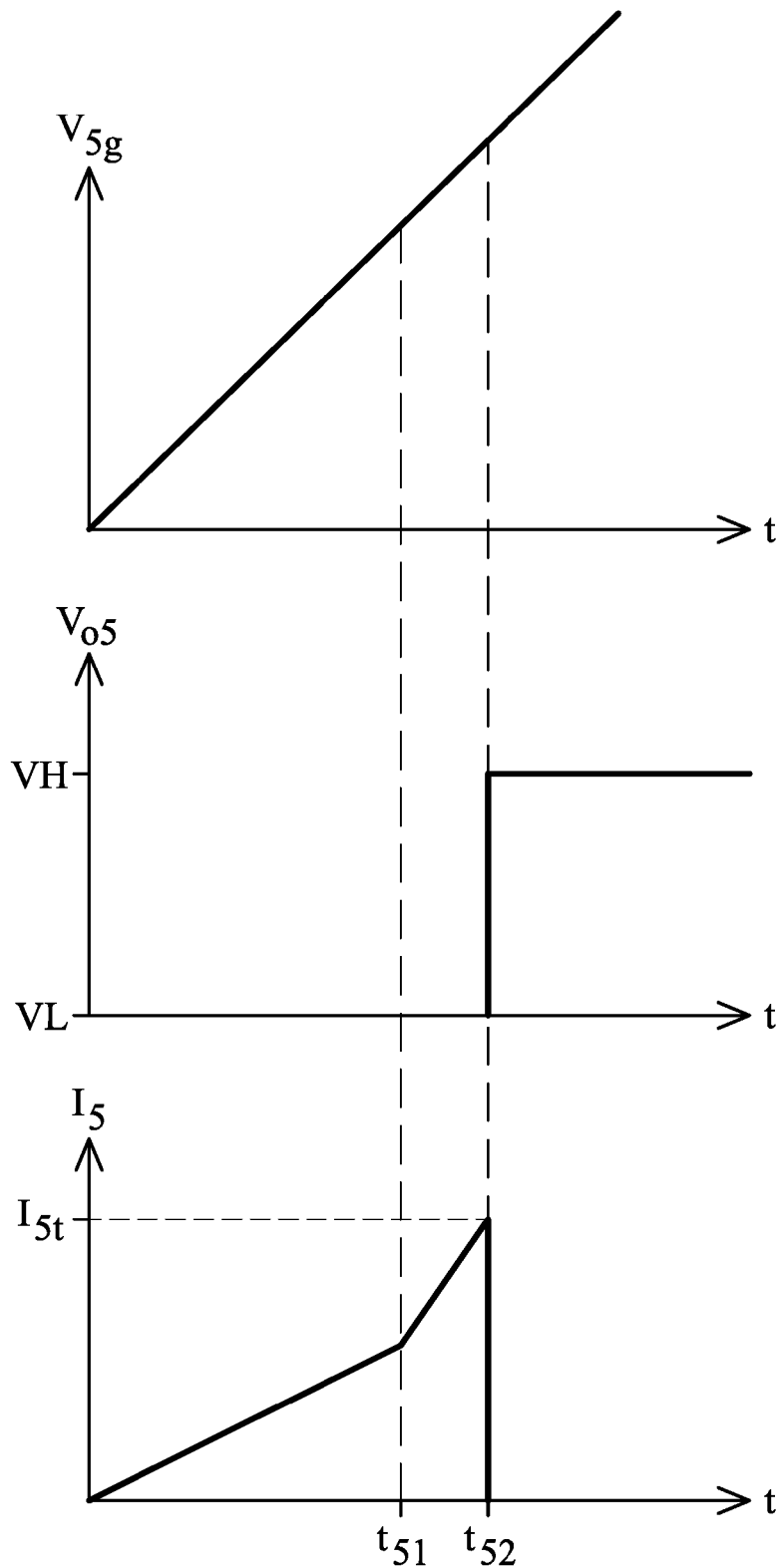
FIG. 5B is the voltage and current waveforms correspond to the writing operation of FIG. 5A.

The writing operation of the variable-resistance memory 500 may be illustrated in FIG. 5B. As shown in FIG. 5B, the current $I_5$, which flows through the transistor $M_{51}$ and the variable-resistance component $R_{51}$, increases based on the voltage signal $V_{5g}$. At time $t_{51}$, the variable-resistance component $R_{51}$ performs the resistance conversion, which converts the resistance of the variable-resistance component $R_{51}$ from high resistance to low resistance. Accordingly, the current $I_5$ rapidly increases. At time $t_{52}$, the current $I_5$ is greater than or equal to a predetermined current $I_{5t}$. The current mirror circuit of the detection circuit 504 provides a current corresponding to the $I_5$ to the resistor $R_5$, which makes the voltage measured across the resistor $R_5$ higher than the voltage $V_{5b}$. In such cases, the output voltage $V_{o5}$ of the detection circuit 504 is changed from the voltage $V_L$ to the voltage $V_H$, and then the detection circuit 504 transmits the output voltage $V_{o5}$ to a controller of the variable-resistance memory 500. Afterward, the controller controls the switch circuit 503 to disconnect the connection linked by the switch circuit 503 based on the output voltage $V_{o5}$ with the voltage $V_H$ (i.e. the detection signal), which terminates the writing operation.

In some embodiments, variable-resistance component $R_{51}$ may be adopted by a Spin Torque Transfer (STT) RAM, a unipolar resistance random access memory, or a bipolar resistance random access memory. In some embodiments, the detection circuit 504 may use large components (e.g. transistors or resistors with a relatively large size compared to other components in the same circuit design), which may reduce the impact of the process variation and control the current $I_5$ accurately.

Figure 6A:
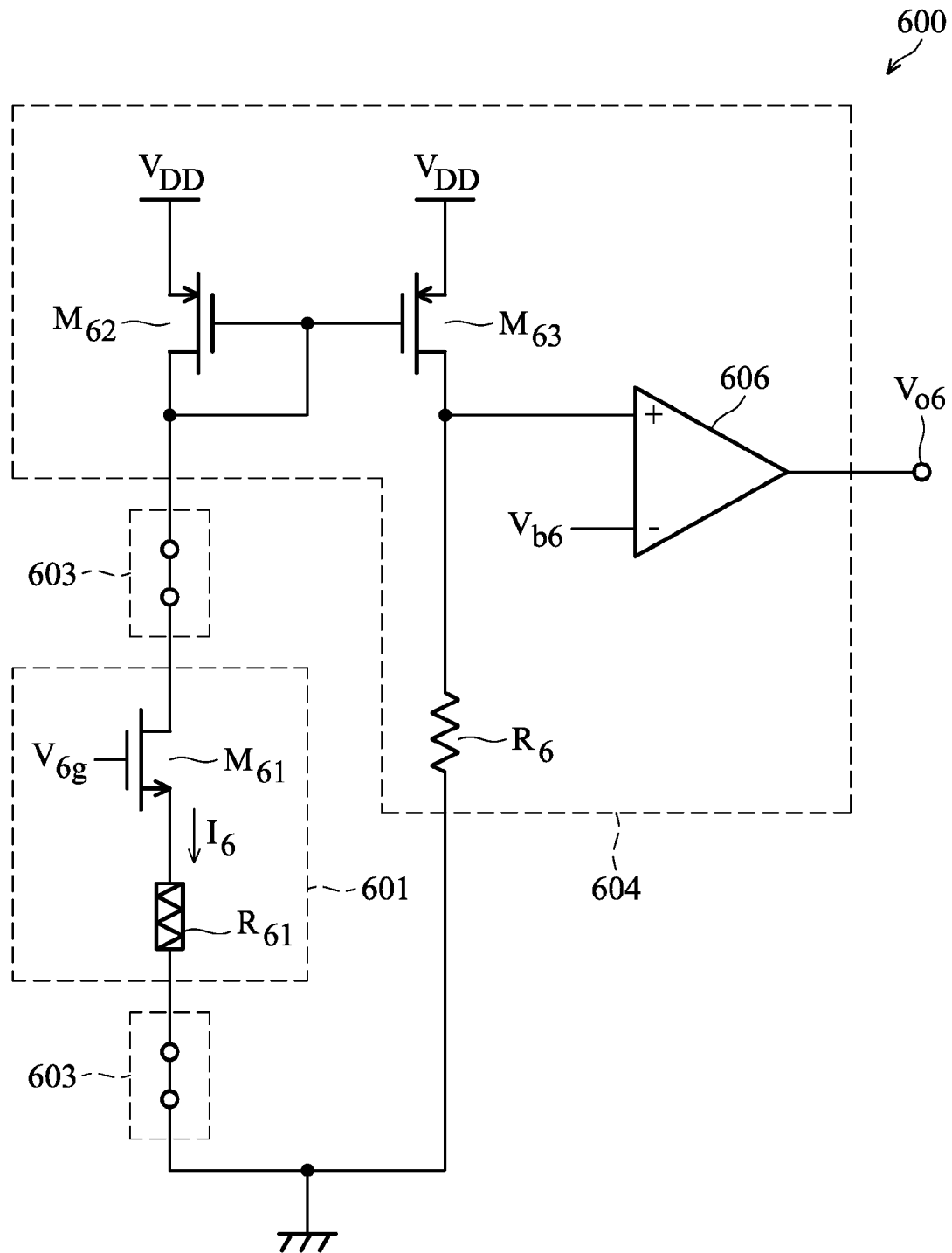
FIG. 6A is a schematic view for another writing operation according to an exemplary embodiment.

FIG. 6A is a schematic view for a writing operation of a variable-resistance memory 600 according to an exemplary embodiment. FIG. 6A depicts a variable-resistance memory 600 including a variable-resistance memory cell 601, a switch circuit 603, and a detection circuit 604. The circuit arrangement in FIG. 6A may correspond to the circuit arrangement of the first writing operation in FIG. 2A.

The variable-resistance memory cell 601 includes a transistor $M_{61}$ and a variable-resistance component $R_{61}$. The gate of the transistor $M_{61}$ receives a voltage signal $V_{6g}$ transmitted from a voltage-signal-generation circuit of the variable-resistance memory 600. The detection circuit 604 includes a current mirror circuit that consists of transistors $M_{62}$ and $M_{63}$, the operational amplifier 606, and the resistor $R_6$, wherein the detection circuit 604 is coupled to a supply voltage $V_{DD}$ and the voltage $V_{b6}$. In this embodiment, the detection circuit 604 continuously detects the current $I_6$ flowing through the transistor $M_{61}$ and the variable-resistance component $R_{61}$.

Figure 6B:
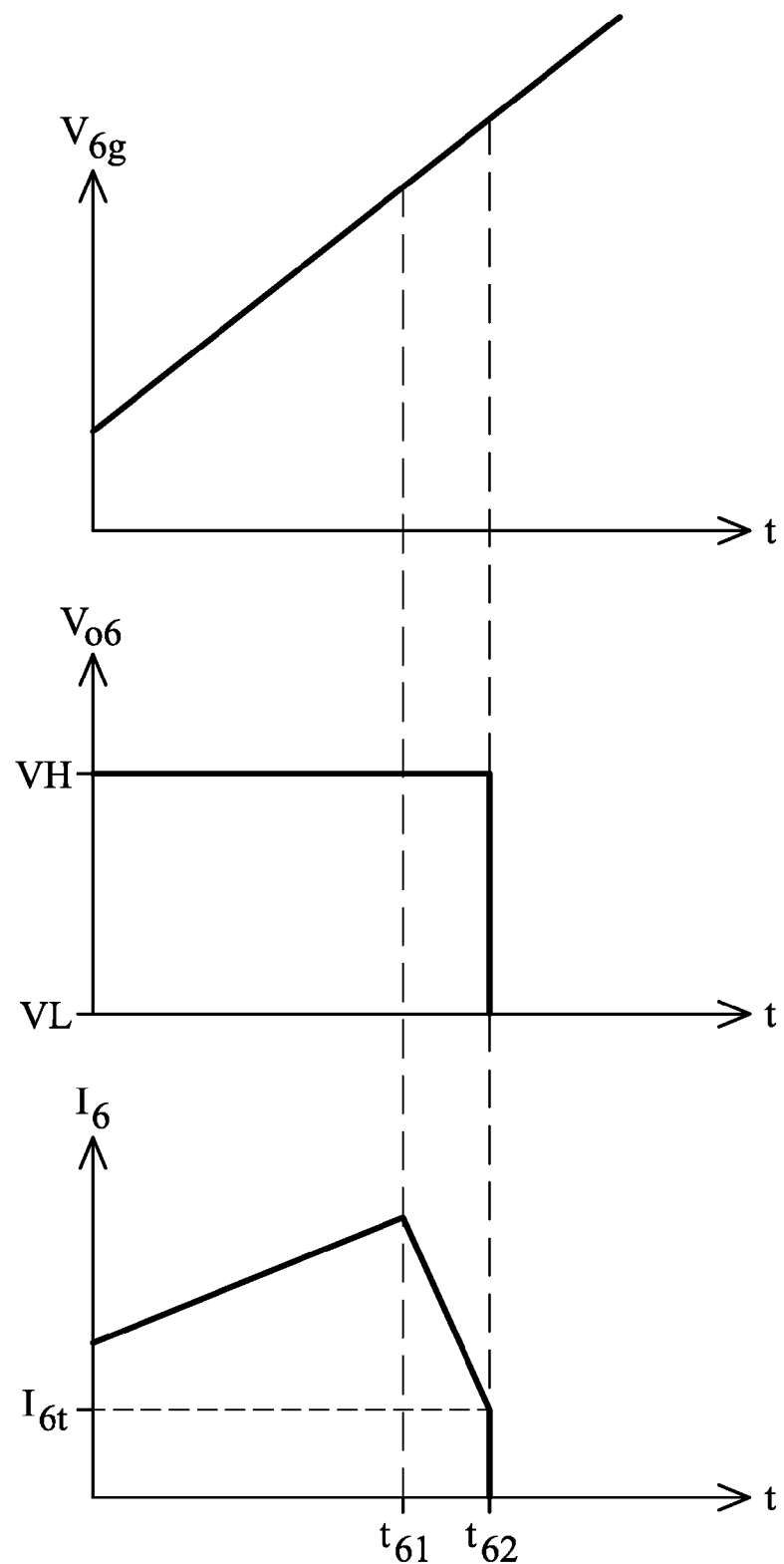
FIG. 6B is the voltage and current waveforms correspond to the writing operation of FIG. 6A.

The writing operation of the variable-resistance memory 600 may be illustrated in FIG. 6B. As shown in FIG. 6B, the current $I_6$, which flows through the transistor $M_{61}$ and the variable-resistance component $R_{61}$, increases based on the voltage signal $V_{6g}$. At time $t_{61}$, the variable-resistance component $R_{61}$ performs the resistance conversion, which converts the resistance of the variable-resistance component $R_{61}$ from low resistance to high resistance. Accordingly, the current $I_6$ rapidly decreases. At time $t_{62}$, the current $I_6$ is lower than or equal to a predetermined current $I_{6t}$. The current mirror circuit of the detection circuit 604 provides a current corresponding to the $I_6$ to the resistor $R_6$, which makes the voltage measured across the resistor $R_6$ lower than the voltage $V_{6b}$. In such cases, the output voltage $V_{o6}$ of the detection circuit 604 is changed from the voltage $V_H$ to the voltage $V_L$, and then the detection circuit 604 transmits the output voltage $V_{o6}$ to a controller of the variable-resistance memory 600. Afterward, the controller controls the switch circuit 603 to disconnect the connection linked by the switch circuit 603 based on the output voltage $V_{o6}$ with the voltage $V_L$ (i.e. the detection signal), which terminates the writing operation. In this embodiment, when the variable-resistance memory 600 performs the writing operation based on the resistance conversion, which converts the low resistance to high resistance, the variable-resistance memory 600 can continuously detects the current $I_6$ flowing through the transistor $M_{61}$ and the variable-resistance component $R_{61}$ to efficiently determine whether the writing operation is complete. In other words, according to the embodiments shown in FIG. 6A-6B, the present embodiment provides a writing-verification operation. The writing-verification operation of the present embodiment is more time efficient and more power efficient than the writing-verification operation which executes the writing operation and the verification operation separately.

In some embodiments, a variable-resistance component $R_{61}$ may be adopted by a Spin Torque Transfer (STT) RAM, a unipolar resistance random access memory, or a bipolar resistance random access memory. In some embodiments, after the controller of the variable-resistance memory 600 activates the voltage-signal-generation circuit to transmit the voltage signal $V_{6g}$ to the gate of the transistor $M_{61}$, the controller delays reception of the output voltage $V_{o6}$ of the detection circuit 604 for a predetermined time.

Figure 7:
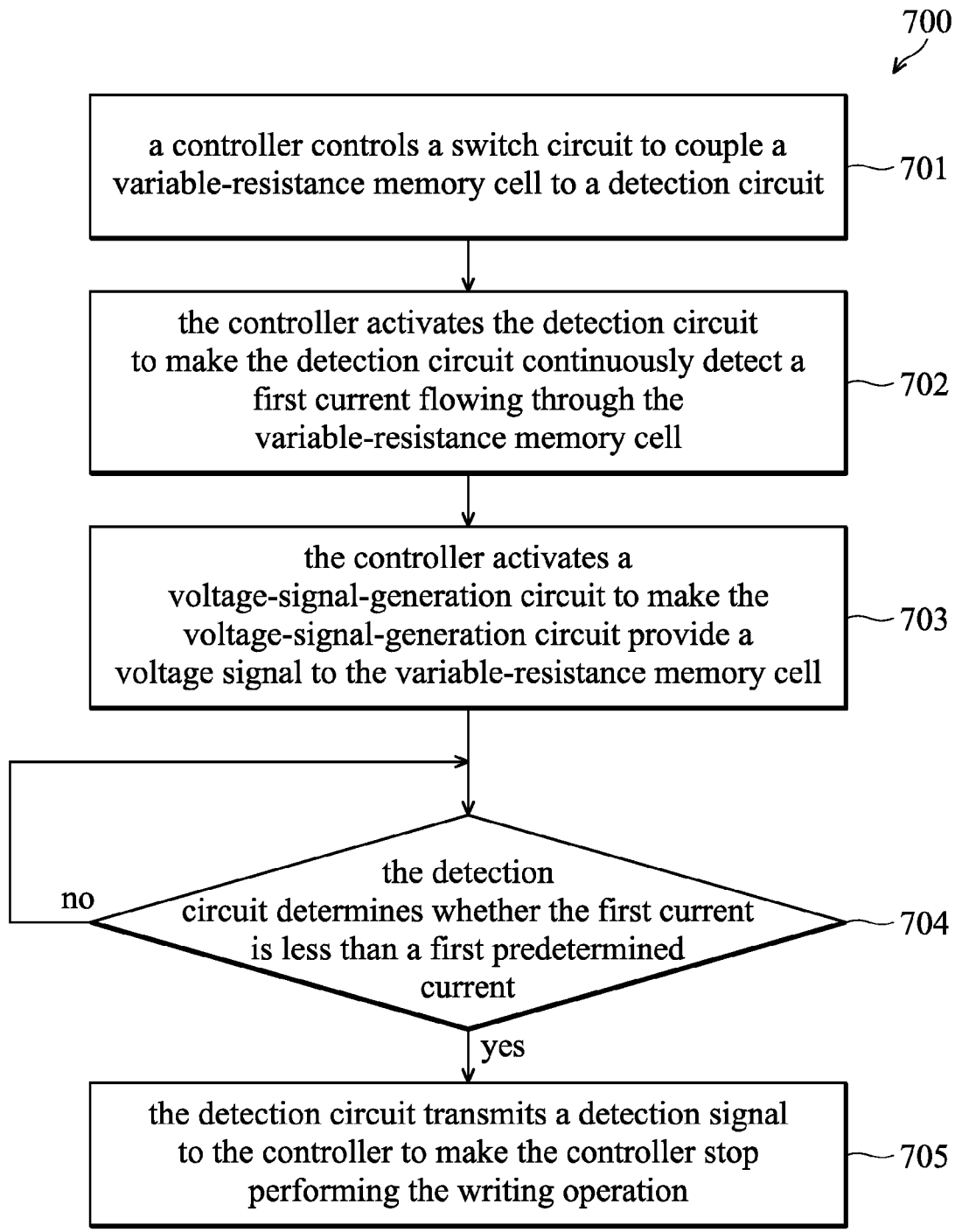
FIG. 7 is a flow diagram of a writing operation according to an exemplary embodiment.

FIG. 7 is a flow diagram 700 of a writing operation according to an exemplary embodiment. The flow diagram 700 may be applied to the circuit in FIG. 2A or FIG. 6A. In step 701, a controller controls a switch circuit to couple a variable-resistance memory cell to a detection circuit. In step 702, the controller activates the detection circuit to make the detection circuit continuously detect a first current flowing through the variable-resistance memory cell. In step 703, the controller activates a voltage-signal-generation circuit to make the voltage-signal-generation circuit provide a voltage signal to the variable-resistance memory cell. In step 704, the detection circuit determines whether the first current is less than a first predetermined current. If the first current is less than the first predetermined current, the writing operation proceeds to step 705. Otherwise, the writing operation proceeds to step 704. In step 705, the detection circuit transmits a detection signal to the controller to make the controller stop performing the writing operation.

In some embodiments, after the controller activates the voltage-signal-generation circuit, the controller delays reception of the detection signal for a predetermined time.

Figure 8:
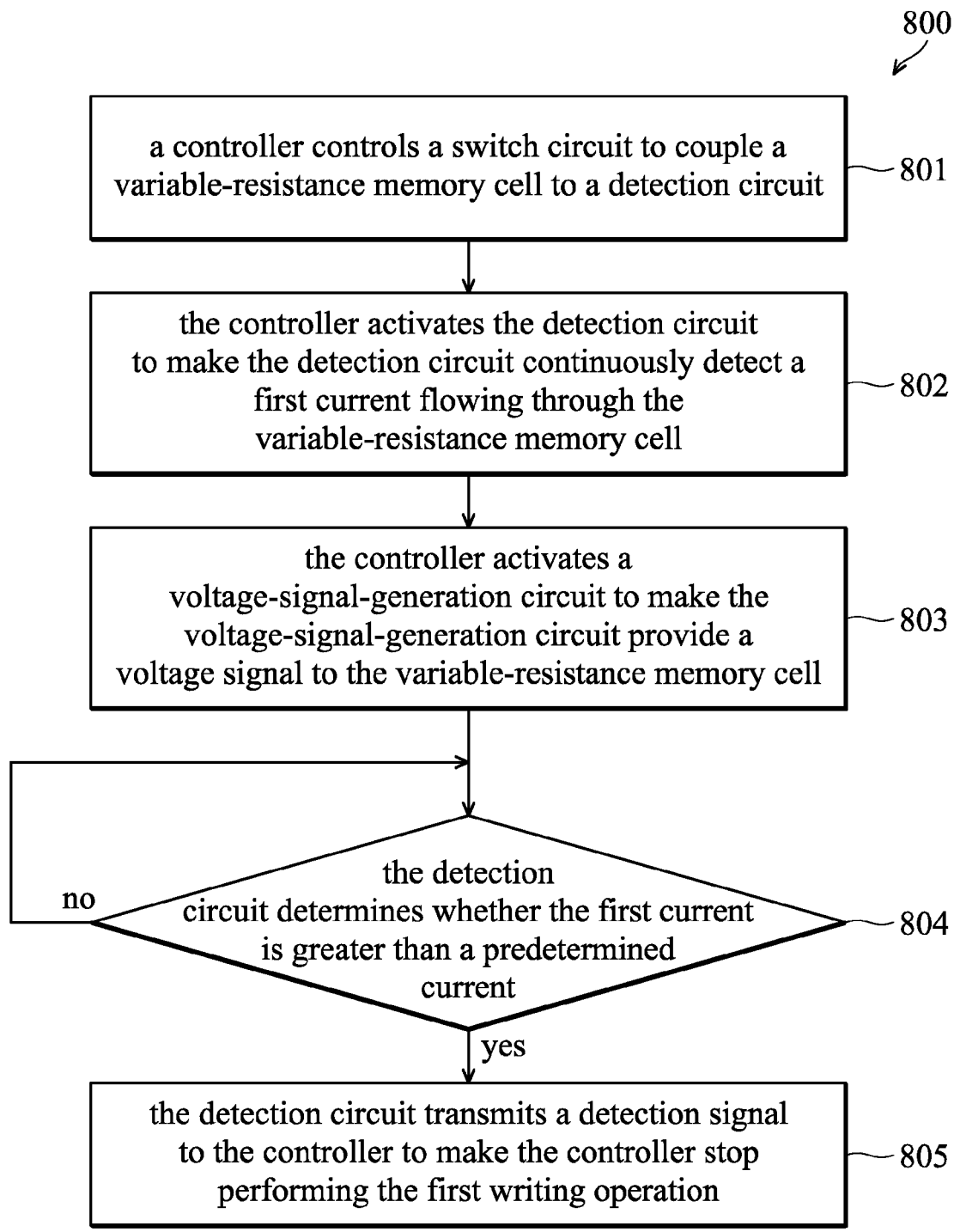
FIG. 8 is a flow diagram of a writing operation according to an exemplary embodiment.

FIG. 8 is a flow diagram 800 of a writing operation according to an exemplary embodiment. The flow diagram 800 may be applied to the circuit in FIG. 2B or FIG. 5A. In step 801, a controller controls a switch circuit to couple a variable-resistance memory cell to a detection circuit. In step 802, the controller activates the detection circuit to make the detection circuit continuously detect a first current flowing through the variable-resistance memory cell. In step 803, the controller activates a voltage-signal-generation circuit to make the voltage-signal-generation circuit provide a voltage signal to the variable-resistance memory cell. In step 804, the detection circuit determines whether the first current is greater than a predetermined current. If the first current is greater than the predetermined current, the writing operation proceeds to step 805. Otherwise, the writing operation proceeds to step 804. In step 805, the detection circuit transmits a detection signal to the controller to make the controller stop performing the first writing operation.

It will be apparent to those skilled in the art that various modifications and variations can be made to the disclosed embodiments. It is intended that the specification and examples be considered as exemplary only, with a true scope of the disclosure being indicated by the following claims and their equivalents.

What is claimed is:

1. A variable-resistance memory, comprising:
a variable-resistance memory cell, comprising a variable-resistance component and a transistor, wherein a first terminal of the transistor is connected to a first terminal of the variable-resistance component;
a voltage-signal-generation circuit, coupled to a control terminal of the transistor;
a switch circuit, coupled to a second terminal of the transistor and a second terminal of the variable-resistance component;
a detection circuit, coupled to a voltage source, wherein a first terminal and a second terminal of the detection circuit are coupled to the switch circuit; and
a controller, coupled to the voltage-signal-generation circuit, the switch circuit, and the detection circuit;
wherein the controller executes control actions when the controller performs a first writing operation on the variable-resistance memory cell, and the control actions comprise:
controlling the switch circuit to make the second terminal of the variable-resistance component couple to the first terminal of the detection circuit and make the second terminal of the transistor couple to the second terminal of the detection circuit;
activating the detection circuit to let the detection circuit continuously detect a first current flowing through the variable-resistance component; and
activating the voltage-signal-generation circuit to let the voltage-signal-generation circuit provide a voltage signal to the control terminal of the transistor;
wherein if the detection circuit determines that the first current is less than a first predetermined current when the controller performs the first writing operation on the variable-resistance memory cell, then the detection circuit transmits a detection signal to the controller to make the controller stop performing the first writing operation.

2. The variable-resistance memory as claimed in claim 1, wherein the controller executes second control actions when the controller performs a second writing operation on the variable-resistance memory cell, and the second control actions comprise:
controlling the switch circuit to make the second terminal of the variable-resistance component couple to the second terminal of the detection circuit and make the second terminal of the transistor couple to the first terminal of the detection circuit;
activating the detection circuit to let the detection circuit continuously detect a second current flowing through the variable-resistance component; and
activating the voltage-signal-generation circuit to let the voltage-signal-generation circuit provide a second voltage signal to the control terminal of the transistor;
wherein if the detection circuit determines that the second current is greater than a second predetermined current when the controller performs the second writing operation on the variable-resistance memory cell, then the detection circuit transmits a second detection signal to the controller to make the controller stop performing the second writing operation.

3. The variable-resistance memory as claimed in claim 1, wherein the controller delays reception of the detection signal for a predetermined time after the controller activates the voltage-signal-generation circuit.

4. The variable-resistance memory as claimed in claim 2, wherein the voltage values of the voltage signal and the second voltage signal increase with time.

5. The variable-resistance memory as claimed in claim 2, wherein the voltage signal and the second voltage signal have the same voltage waveform.

6. The variable-resistance memory as claimed in claim 1, wherein when the controller stops performing the first writing operation, the controller controls the switch circuit to disconnect a connection between the detection circuit and the transistor or disconnect a connection between the detection circuit and the variable-resistance component.

7. The variable-resistance memory as claimed in claim 2, wherein when the controller stops performing the first writing operation or the second writing operation, the controller controls the switch circuit to disconnect a connection between the detection circuit and the transistor or disconnect a connection between the detection circuit and the variable-resistance component.

8. The variable-resistance memory as claimed in claim 1, wherein when the controller stops performing the first writing operation, the controller turns the voltage-signal-generation circuit off.

9. The variable-resistance memory as claimed in claim 2, wherein when the controller stops performing the first writing operation or the second writing operation, the controller turns the voltage-signal-generation circuit off.

10. The variable-resistance memory as claimed in claim 1, wherein the variable-resistance component is adopted by a Spin Torque Transfer (STT) random access memory, a unipolar resistance random access memory, or a bipolar resistance random access memory.

11. A writing method of a variable-resistance memory, comprising:
  performing, by a controller, a first writing operation on a variable-resistance memory cell, wherein the first writing operation comprises:
    controlling, by the controller, a switch circuit to make a first terminal of a variable-resistance component of the variable-resistance memory cell couple to a first terminal of a detection circuit and make a first terminal of a transistor of the variable-resistance memory cell couple to a second terminal of the detection circuit;
    activating, by the controller, the detection circuit to let the detection circuit continuously detect a first current flowing through the variable-resistance component;
    activating, by the controller, a voltage-signal-generation circuit to let the voltage-signal-generation circuit provide a voltage signal to a control terminal of the transistor; and
    if the detection circuit determines that the first current is less than a first predetermined current, then the detection circuit transmits a detection signal to the controller to make the controller stop performing the first writing operation.

12. The writing method as claimed in claim 11, further comprising:
  performing, by the controller, a second writing operation on the variable-resistance memory cell, wherein the second writing operation comprises:
    controlling the switch circuit, by the controller, to make the first terminal of the variable-resistance component couple to the second terminal of the detection circuit and make the first terminal of the transistor couple to the first terminal of the detection circuit;
    activating, by the controller, the detection circuit to let the detection circuit continuously detect a second current flowing through the variable-resistance component;
    activating, by the controller, the voltage-signal-generation circuit to let the voltage-signal-generation circuit provide a second voltage signal to the control terminal of the transistor; and
    if the detection circuit determines that the second current is greater than a second predetermined current, then the detection circuit transmits a second detection signal to the controller to make the controller stop performing the second writing operation.

13. The writing method as claimed in claim 11, wherein the controller delays reception of the detection signal for a predetermined time after the controller activates the voltage-signal-generation circuit.

14. The writing method as claimed in claim 12, wherein the voltage values of the voltage signal and the second voltage signal increase with time.

15. The writing method as claimed in claim 12, wherein the voltage signal and the second voltage signal have the same voltage waveform.

16. The writing method as claimed in claim 11, wherein when the controller stops performing the first writing operation, the controller controls the switch circuit to disconnect a connection between the detection circuit and the transistor or disconnect a connection between the detection circuit and the variable-resistance component.

17. The writing method as claimed in claim 12, wherein when the controller stops performing the first writing operation or the second writing operation, the controller controls the switch circuit to disconnect a connection between the detection circuit and the transistor or disconnect a connection between the detection circuit and the variable-resistance component.

18. The writing method as claimed in claim 11, wherein when the controller stops performing the first writing operation, the controller turns the voltage-signal-generation circuit off.

19. The writing method as claimed in claim 12, wherein when the controller stops performing the first writing operation or the second writing operation, the controller turns the voltage-signal-generation circuit off.

* * * * *